United States Patent [19]
Glatfelter et al.

[11] Patent Number: 6,136,141
[45] Date of Patent: Oct. 24, 2000

[54] METHOD AND APPARATUS FOR THE FABRICATION OF LIGHTWEIGHT SEMICONDUCTOR DEVICES

[75] Inventors: Troy Glatfelter, Royal Oak; Mark Lycette, Berkley; Eric Akkashian, Ferndale, all of Mich.

[73] Assignee: Sky Solar L.L.C., Troy, Mich.

[21] Appl. No.: 09/095,293

[22] Filed: Jun. 10, 1998

[51] Int. Cl.[7] ............................. B32B 31/28; B23K 26/00

[52] U.S. Cl. ...................... 156/380.9; 156/390; 156/510; 156/584; 156/254; 156/272.8; 156/247; 156/344; 438/62; 438/484; 219/121.6; 219/121.65; 219/121.67

[58] Field of Search ..................................... 156/247, 254, 156/272.8, 275.7, 280, 323, 344, 379.8, 380.9, 390, 510, 584; 438/62, 96, 479, 484, 485; 204/298.24, 298.25; 118/718, 719, 729, 730; 219/121.65, 121.66, 121.67, 121.72, 121.85, 121.6; 136/249, 258

[56] References Cited

U.S. PATENT DOCUMENTS

| | | | |
|---|---|---|---|
| 4,185,185 | 1/1980 | Adlam | 219/121.85 |
| 4,328,410 | 5/1982 | Slivinsky et al. | 219/121 |
| 4,341,588 | 7/1982 | Sterling | 156/601 |
| 4,379,020 | 4/1983 | Glaeser et al. | 156/603 |
| 4,663,829 | 5/1987 | Hartman et al. | 29/572 |
| 5,378,639 | 1/1995 | Sasaki et al. | 437/4 |

Primary Examiner—Michael W. Ball
Assistant Examiner—Michael A Tolin
Attorney, Agent, or Firm—Gifford, Krass, Groh, Sprinkle, Anderson & Citkowski, P.C.

[57] ABSTRACT

Lightweight semiconductor devices are fabricated upon a relatively thin substrate member by a process wherein the substrate is first bonded to a relatively thick support member. The semiconductor device is then formed on the bonded substrate, and the substrate is subsequently removed from the support member by utilizing a beam of radiant energy to skive the substrate from the support member without damage to the semiconductor device. Also disclosed herein is a system for implementing the invention.

4 Claims, 2 Drawing Sheets

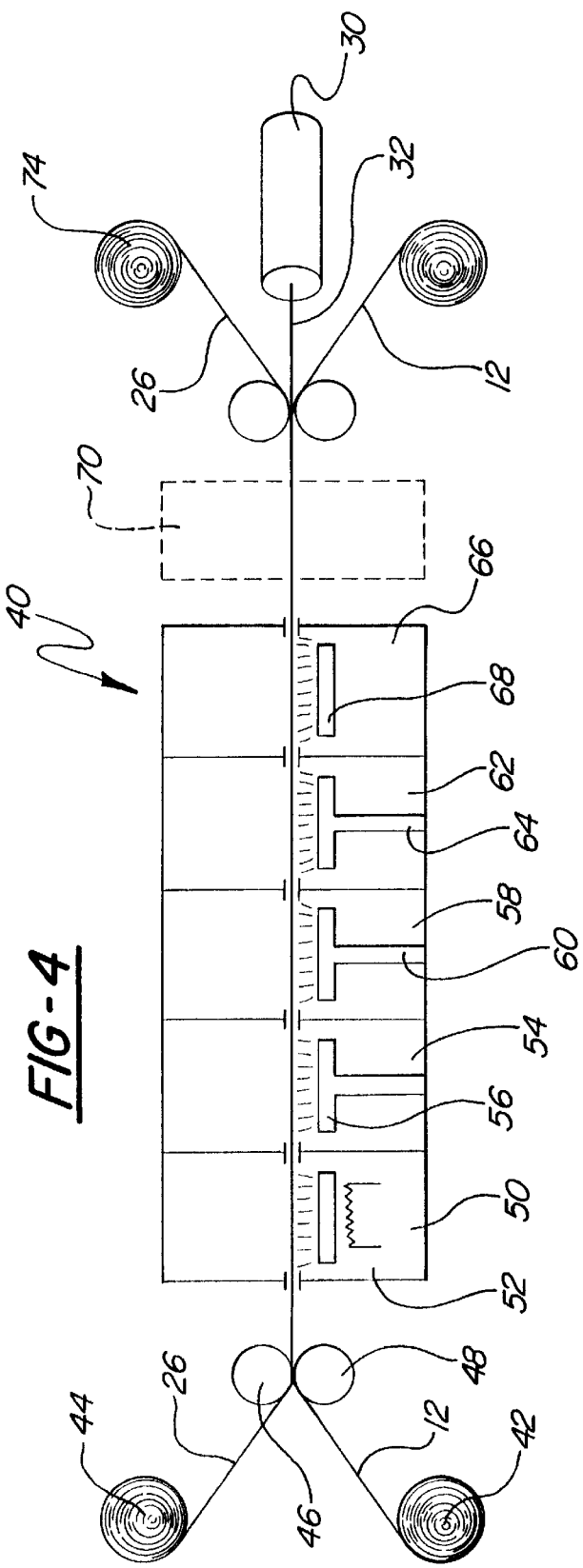
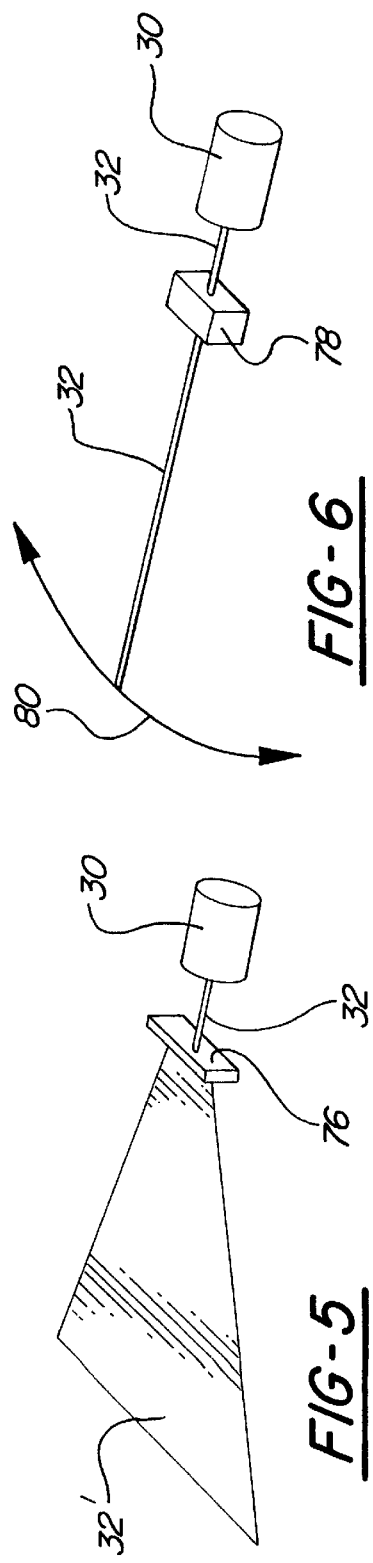

METHOD AND APPARATUS FOR THE FABRICATION OF LIGHTWEIGHT SEMICONDUCTOR DEVICES

FIELD OF THE INVENTION

This invention relates generally to the fabrication of semiconductor devices. Specifically it relates to the fabrication of semiconductor devices on lightweight substrates. Most specifically the invention relates to a method and apparatus for the fabrication of a semiconductor device upon a lightweight substrate which is itself disposed upon a support member, which support member is subsequently removed to produce a free standing, lightweight semiconductor device.

BACKGROUND OF THE INVENTION

Weight is often a factor in the design of semiconductor devices, particularly when those devices are to be employed in aerospace applications. Weight is a very significant parameter for large area semiconductor devices such as photovoltaic generating units. Photovoltaic devices based upon single crystal materials are inherently rigid, brittle and heavy, and these factors often limit their applicability. A number of thin film semiconductor materials have been developed which are equivalent, and in many instances superior, to single crystal materials. These thin film semiconductor materials are light in weight, and amenable to being deposited in relatively thin, flexible films over large areas and at relatively low cost. These thin film materials include amorphous, nanocrystalline, microcrystalline and polycrystalline materials as well as composites.

Thin film semiconductor materials are usually supported on a substrate, and such substrates should be compatible with the semiconductor materials and have good dimensional stability under conditions encountered during the fabrication of the device and its service life. In many instances, thin film semiconductor materials are fabricated by vacuum deposition techniques such as glow discharge deposition, evaporation, sputtering or chemical vapor deposition. As a consequence, the substrate will be exposed to relatively high temperatures and low atmospheric pressures. In addition, thin film semiconductor materials, particularly for large scale applications, are fabricated by automated, high volume, roll-to-roll deposition processes, and in such processes the substrates are additionally subject to relatively high tensile forces.

It will thus be appreciated that substrates for thin film semiconductor materials must meet a number of relatively high standards for strength and stability. In many instances, thin film semiconductor materials are fabricated upon rigid glass or ceramic substrates. Such materials are heavy, relatively expensive, and not readily amenable to roll-to-roll deposition processes, as is required for the fabrication of large area devices. In many other instances, thin film semiconductor devices are fabricated upon flexible, metallic substrates. While devices thus fabricated are flexible and relatively light in weight, the metal substrate comprises almost all of the bulk of the device, and for large area, aerospace applications, it is very desirable to further limit the weight of the devices. As a consequence, a number of efforts have been made to fabricate large area semiconductor devices onto very thin polymeric substrates. A number of polymeric materials, particularly polyimides, and equivalent materials, have very good dimensional stability and are compatible with thin film semiconductor materials. However, such polymeric materials tend to soften under the high temperature conditions encountered in many vacuum deposition processes, and hence do not have sufficient tensile strength, at elevated temperatures, to be used in high volume fabrication processes such as roll-to-roll processes. In addition, relatively thin substrate materials can be difficult to handle during other stages of device fabrication such as encapsulation, connection of conductive leads, module fabrication and the like.

A number of approaches have been implemented in the prior art for the problem of fabricating semiconductor devices on lightweight substrates. As disclosed in U.S. Pat. Nos. 4,663,828 and 4,663,829, lightweight photovoltaic cells are fabricated by a process wherein semiconductor material is deposited onto a surrogate substrate. The layers of semiconductor material are then removed from the surrogate substrate by thermally shocking the semiconductor material to cause it to debond from the substrate. The freed semiconductor film is then encapsulated or otherwise configured into a photovoltaic device. Since the relatively thick surrogate substrate functions as a heat sink, relatively large thermal shocks must be applied to the structure to effect the delamination. Also, the freed semiconductor film is relatively fragile and can be subject to damage. Accordingly, it is preferable that the semiconductor device remain upon the substrate upon which it was initially deposited.

In other approaches to this problem, as noted in the aforementioned patents, semiconductor devices are fabricated upon metallic substrates which are then either completely removed or thinned down by an etching process. In other variations of this technique, semiconductor devices are fabricated upon relatively thin polymeric substrates which in turn are supported upon metallic substrates which are chemically etched away. In both of these approaches, relatively large amounts of metal must be removed in chemical baths which are highly corrosive. In addition to being time consuming and expensive, these techniques can damage semiconductor layers, contacts and other portions of the semiconductor device. Therefore, there is still a need for a method for the fabrication of semiconductor devices upon relatively thin substrates, which method does not require chemical etching of a substrate and which does not expose semiconductor layers to high thermal stresses.

As will explained in greater detail hereinbelow, the present invention provides a simple, easy to implement method wherein a thin polymeric substrate is supported upon a relatively thick support member during fabrication and processing of a semiconductor device. In accord with the present invention, the semiconductor device is then stripped from the support member by a skiving process implemented through the use of a beam of radiant energy. The process does not directly expose the semiconductor layers to any source of thermal energy or to any corrosive environment. These and other advantages of the present invention will be readily apparent from the drawings, discussion and description which follow.

BRIEF DESCRIPTION OF THE INVENTION

There is disclosed herein a method for the fabrication of lightweight semiconductor devices. The method includes the steps of providing a substrate having opposed first and second faces; providing a support member; and bonding the first face of the substrate to the support member so as to produce a supported substrate. The method includes the further step of fabricating a semiconductor device upon the second face of the supported substrate, and directing a beam of radiant energy onto a junction region defined between the first face of the substrate and the support member. The beam of radiant energy weakens the bonding between the substrate and support member and permits the removal of the substrate from the support member.

In particular embodiments, the substrate is adhesively bonded to the support member, and after fabrication of the semiconductor device, the beam of radiant energy is directed onto the adhesive so as to free the substrate from the support member. In other embodiments, the substrate is thermoplastically bonded to the support member, and is subsequently freed therefrom by directing the beam of radiant energy onto the thermoplastic bond between the substrate and the support member. In some instances, the beam of radiant energy may be provided by a laser. The beam may either be a fan-shaped beam which is directed onto the entire junction region, or a relatively narrow beam which is scanned across the junction region. In particular embodiments, the substrate comprises a body of polymeric material such as a polyimide polymer.

The present invention may be implemented on a continuous, roll-to-roll basis wherein the substrate and support member each comprise a generally elongated web which is continuously advanced through a plurality of deposition chambers.

Also disclosed herein is a system for carrying out the method of the present invention.

BRIEF DESCRIPTION OF THE DRAWINGS

FIG. 4 is a schematic depiction of a system, structured in accord with the principles of the present invention, as operative to continuously fabricate lightweight photovoltaic devices;

FIG. 5 is a schematic depiction of a fan-shaped laser beam as employed in the practice of the present invention; and FIG. 6 is a schematic depiction of a scanning laser beam as used in the practice of the present invention.

DETAILED DESCRIPTION OF THE INVENTION

The principles of the present invention may be employed in any instance wherein semiconductor devices are being fabricated upon relatively thin, lightweight substrate members. The present invention has significant utility in connection with the fabrication of lightweight, large area photovoltaic devices; therefore, this invention will primarily be described with reference to the fabrication of such large area devices; but, it is to be understood that the principles disclosed herein may be used to equal advantage for the fabrication of other semiconductor devices including, by way of illustration and not limitation, photoconductive devices, diode arrays, large area integrated circuits, active matrix display units, photoconductive devices such as electrophotographic receptors, large area memory arrays, and the like.

Figure 1:
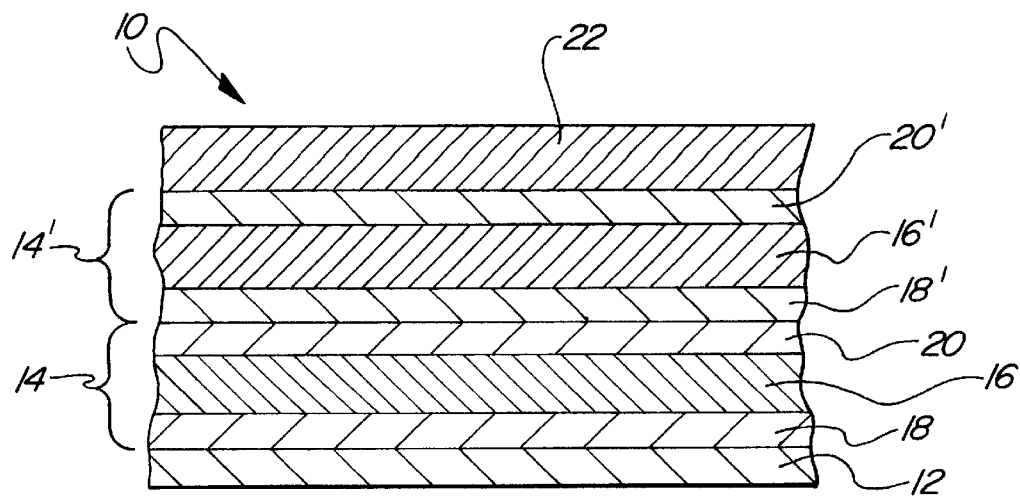
FIG. 1 is a cross-sectional view of a lightweight semiconductor device of the type which may be fabricated through the use of the present invention.

Referring now to FIG. 1, there is shown a cross-sectional view of a lightweight photovoltaic device 10, of the type which may be fabricated through the use of the present invention. The device 10 of FIG. 1 includes a substrate 12, which is a relatively thin, lightweight member. The substrate 12 typically comprises a relatively thin body of polymeric material which is compatible with the remaining layers comprising the device 10 and which has good mechanical stability and strength. One particularly preferred group of polymers comprises polyimides such as the material sold by the DuPont Corporation under the designation Kapton®. Other polymeric substrate materials comprise nylons, polyesters and the like. Typically, the substrates employed in the practice of the present invention have a thickness in the range of 0.5 to 2 mils, although in certain instances thicker or thinner substrates may be employed with equal advantage, and the principles of this invention may be likewise employed. Semiconductor devices will almost always require a bottom electrode, and this electrode will generally comprise a layer of electrically conductive material such as a metal or a metallic oxide which is disposed upon the substrate layer 12. The conductive layer may be separately applied to the substrate prior to the fabrication of the semiconductor device. Alternatively, a layer of electrically conductive material may be applied to a polymeric substrate as the first step in the fabrication of the semiconductor device. In other instances, the substrate 12 may comprise a relatively thin layer of metallic foil, in which instance, a separate electrically conductive layer may not be provided thereupon. It is also to be understood that in some instances, reflective layers, texturizing layers and the like may also be present upon the substrate. Within the context of this disclosure, the term "substrate" shall also include any other such layers that may be present thereupon.

Disposed upon the substrate 12 is a first body of photovoltaic material 14, and disposed thereupon is a second body of photovoltaic material 14'. Each of the bodies of photovoltaic material 14 comprise a triad of photovoltaic layers wherein a body of substantially intrinsic photovoltaic material 16, 16' is interposed between oppositely doped layers of photovoltaic material. For example, a layer of intrinsic material 16 is disposed between a bottommost layer of n type photovoltaic material 18, and a topmost layer of p type photovoltaic material 20, which in one preferred embodiment comprises a microcrystalline photovoltaic material. Accordingly, the layers 16, 18 and 20 will function as a p-i-n type photovoltaic device. The second device 14' likewise comprises a layer of n doped material 18' and a layer of p doped material 20' disposed on either side of the layer of intrinsic material 16'. Tile device 10 of FIG. 1 further includes a top electrode layer 22, which in this embodiment comprises a transparent, electrically conductive material such as a transparent electrically conductive oxide which functions, in combination with a bottom, substrate electrode to permit withdrawal of photocurrents from the device. In other instances, the top electrode 22 may comprise a metallic layer.

As illustrated in FIG. 1, the photovoltaic device 10 comprises two stacked p-i-n type devices 14, 14'. One of skill in the art will appreciate that photovoltaic devices comprising only one triad, or more than two triads, may be similarly configured. It is also to be understood that in many instances, the device 10 of FIG. 1 may further include current collecting grids, bus bars and the like associated with top electrode 22 or a substrate electrode. Also, the device may have an encapsulating material disposed upon the top and/or bottom surface thereof to provide further support and atmospheric protection. It is an important feature of the present invention that this invention permits the ready fabrication of large area thin film semiconductor devices onto relatively thin, flexible substrates.

Figure 2:
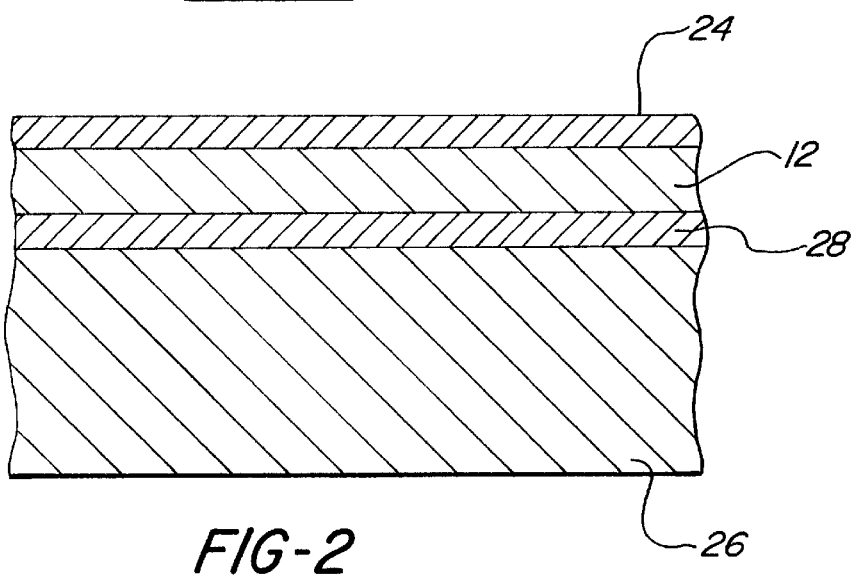
FIG. 2 is a cross-sectional view of a semiconductor device which is disposed upon a relatively thin lightweight substrate, which in turn is bonded to a support member in accord with the present invention.

Referring now to FIG. 2, there is shown a layer of substrate material 12, which as noted hereinabove, may comprise a layer of polymeric material or a layer of metallic material. The layer of substrate material 12 further includes a semiconductor device 24 supported thereupon. The semiconductor device 24 is shown schematically as being a single layer; but it is to be understood that it will include a number of discrete layers of semiconductor material as well as electrodes, contacts and the like. The semiconductor device 24 is disposed upon a second face of the substrate 12, and a first face of the substrate 12 is bonded to a support member 26. In the FIG. 2 illustration, bonding is accomplished by a layer of adhesive material 28, although it is to be understood that bonding may also be accomplished by thermoplastically bonding the substrate 12 and support member 26 by heat and/or pressure without the use of additional adhesives.

The support member 26 is a relatively thick, somewhat rigid member, and in some instances is fabricated from sheet metal having a thickness in the range of 2–10 mils. While sheet metal is one preferred support member, since it provides both strength and flexibility, in some instances the support member 26 may be fabricated from a rigid material such as glass, ceramics, metal plates or relatively thick polymeric plates.

It will be appreciated from FIG. 2 that the support member 26 provides strength and rigidity to the relatively thin substrate member 12 so as to facilitate the fabrication of the semiconductor device 24 thereupon. Supported substrates have been utilized in the prior art, as noted above, but removal of the support from the substrate can be difficult since the substrate must be bonded to the support member tightly enough to resist high temperature, low pressure conditions typically encountered during preparation of semiconductor devices; yet it must be readily removable therefrom without requiring excessive heat, pressure or the use of corrosive chemicals.

In accord with the present invention, it has been found that a thin layer of substrate material may be readily removed from a thick support member by the use of an appropriately directed beam of radiant energy. This beam most typically comprises a beam of laser energy. The beam may be readily focused and directed onto the junction region between the substrate and support member. The beam has a wavelength and power level sufficient to weaken the bond between the substrate and support member, but since it is carefully focused and directed, damage to the semiconductor device is avoided.

Figure 3:
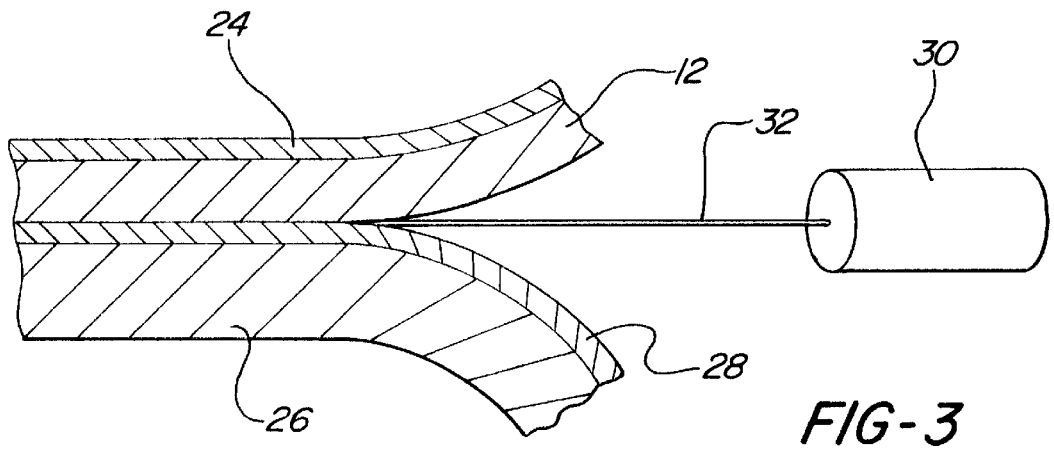
FIG. 3 is a schematic depiction showing a substrate, with a semiconductor device disposed thereupon, which is being debonded from a support member.

Referring now to FIG. 3, there is shown a schematic depiction of one embodiment of the present invention wherein a structure generally similar to that of FIG. 2 is being debonded. As specifically shown in FIG. 3, a substrate 12 has semiconductor device 24 disposed upon its top surface. The bottom surface of the substrate 12 is bonded to the support member 26 by a layer of adhesive 28. A laser 30 is positioned so as to project a beam of light 32 onto a junction region between the substrate 12 and support member 26. The beam of laser light 32 heats the adhesive 28 thereby breaking the bond between the substrate 12 and support member 26. This permits the substrate 12 and semiconductor device 24 to be removed from the support member 26. As depicted, the laser beam 32 does not directly illuminate the semiconductor device thereby avoiding damage thereto. Generally, the level of power of the laser need not be sufficient to vaporize material at the junction region of the substrate and support member. It is generally sufficient that the laser have the capability of softening the bond therebetween. For this purpose, lasers having an output in the visible and near infrared portions of the spectrum may be employed. In yet other instances, the substrate 12 may be bonded to the support member 26 by a photodegradable material. Such materials are known in the art, and comprise polymers which break down upon exposure to light, typically in the ultraviolet and near ultraviolet portions of the spectrum. Such materials may be employed to bond the substrate 12 to the support member 26, and the bond therebetween may be photochemically broken by use of a beam of light 32.

In yet other instances, the substrate 12 may be directly adhered to the substrate 26 by a thermoplastic bond formed through the application of heat and/or pressure. Such a bond is formed by softening, and subsequent rehardening of the substrate and/or support member. In such instance, the thermoplastic bond can be reversed by the application of a beam of radiant energy 32 thereto.

It will thus be seen from the FIG. 3 illustration that, in accord with the present invention, a beam of radiant energy 32 may be used in a manner analogous to a skiving knife to remove the substrate 12 from the support member 26. The beam is readily directed so as to avoid causing any damage to the semiconductor device 24, or any overheating of the substrate 12. Typically, the support member 26 is a relatively massive body of a material such as a metal having good thermal conductivity; therefore, further heat sinking and thermal protection is provided by this body. The methodology of the present invention is readily adaptable to highly automated, large volume semiconductor processing techniques.

Referring now to FIG. 4, there is shown a system 40 for the high volume, roll-to-roll fabrication of p-i-n photovoltaic devices. The system 40 includes a substrate pay off roller 42 having a generally elongated web of substrate material 12 supported thereupon, and dispensable therefrom. The system 40 further includes a support member supply roller 44 having an elongated web of support member material 26 supported thereupon, and dispensable therefrom.

The system 40 includes a bonding station comprised of a pair of opposed rollers 46 and 48 disposed so as to receive the web of substrate material 26 and the web of support material 12. The rollers 46 and 48 apply a compressive force to the webs, and also preferably apply heat thereto. In this context, the rollers themselves may be heated, or an external heat source may be present in the bonding station.

As noted hereinabove, one preferred substrate material comprises a polyimide polymer sold under the designation Kapton® by the DuPont Corporation, and this material is available with an adhesive layer disposed on one side thereof. If such material is being employed, no further source of bonding adhesive is necessary. Clearly, the system of FIG. 4 may also include an adhesive dispenser disposed in the bonding station.

After leaving the bonding station, the supported substrate then proceeds through a multi-chambered fabrication station in which a photovoltaic device is formed thereupon. The substrate first enters a bottom electrode deposition chamber 50 wherein a layer of bottom electrode material, typically a layer of a metal such as aluminum, gold, copper or the like, is coated thereupon. As illustrated herein, the bottom electrode chamber 50 includes a vacuum evaporation source 52 therein for forming this layer, but it is to be understood that other deposition techniques such as sputtering, glow discharge deposition and the like may be similarly employed.

After leaving the bottom electrode chamber, the support substrate enters the first semiconductor layer deposition chamber. This chamber 54 is operative to deposit a layer of n doped semiconductor material onto the substrate, and as illustrated herein comprises a glow discharge deposition station including an electromagnetically energized cathode 56 which operates, as is known in the art, to energize and decompose a semiconductor containing process gas in the chamber so as to cause the deposition of the semiconductor layer onto the substrate. The system further includes the intrinsic layer deposition chamber 58 downstream of the n layer deposition chamber 54. The intrinsic deposition chamber 58 includes an electromagnetically energized cathode 60 as previously described. A p layer deposition chamber 62 is disposed downstream of the i layer deposition chamber 58 and includes an electromagnetically energized cathode 64 as previously described. It is to be understood that these three chambers 54, 58 and 62 operate in sequence to deposit a triad of n-i-p type semiconductor layers. In accord with the present invention, still further groupings of chambers may be employed to fabricate tandem devices of the type illustrated in FIG. 1.

The system 40 of FIG. 4 further includes a top electrode deposition chamber 66 which is operative to deposit a layer of top electrode material onto the previously deposited semiconductor layers. As noted with reference to FIG. 1, this layer of top electrode material most typically comprises a layer of transparent, electrically conductive oxide material, which material is most preferably prepared by a sputtering process. FIG. 4 schematically illustrates the sputtering system 68 disposed in the top electrode deposition chamber 66.

The system 40 of FIG. 4 may include still further stations operative to provide current collecting grids, electrodes and the like atop the semiconductor device. Likewise, other processing stations may be employed to interconnect, encapsulate or otherwise configure the large area photovoltaic device while the substrate is still retained upon the support member, and in this regard, FIG. 4 illustrates such further processing stations 70 in phantom outline.

The system 40 of FIG. 4 further includes a debonding station which includes a laser 30 operative to direct a beam of radiant energy 32 onto the junction region of the substrate 12 and support member 26 so as to debond the substrate 12 therefrom. As illustrated, the freed substrate 12, and associated semiconductor device is wound about a take up reel 72, and the freed support member 26 is wound about support take up reel 74. The substrate 12 and associated semiconductor device can then be further processed or otherwise utilized in accord with its intended purpose, and the support member 26 may be recycled for reuse.

It will be clear that other modifications and variations of the FIG. 4 apparatus may be implemented. For example, the support member 26 may be configured as an endless belt which is directly conveyed back from the debonding station to the bonding station; and toward this end, the system may further include a cleaning station for the support member. It is also to be understood that in some instances, the supported substrate and associated semiconductor device may not be immediately debonded, but may be subjected to further processing steps, including cutting, piercing, mounting and the like, and then debonded from the support member after such processing is complete. It is also to be understood that the present invention may be carried out on a non-roll-to-roll basis, utilizing substrates and support members which are not configured as elongated webs.

In most instances, it is preferable that the source of radiant energy employed to debond the substrate and support member comprise a laser. However, it is also to be understood that in some instances, other sources of intense radiant energy such as arc lamps and the like may be similarly employed. In accord with the present invention, the heat source and resultant beam may be variously configured. For example, FIG. 5 shows a light source, such as a laser 30, having beam expanding optics 76 associated therewith and operative to configure a relatively narrow beam of energy 32 into a fan-shaped beam 32'. This fan-shaped beam 32' may be directed so as to illuminate substantially all of the width of a bonded substrate. Alternatively, and as illustrated in FIG. 6, a light source 30 may have beam directing optics 78 associated therewith for scanning the relatively linear beam 32 across a scanned path 80.

It is to be understood that in view of the teachings presented herein, one of skill in the art could readily implement the present invention in a number of embodiments. The foregoing drawings, discussion and description are illustrative of particular embodiments of the invention, but are not meant to be limitations upon the practice thereof. It is the following claims, including all equivalents, which define the scope of the invention.

What is claimed is:

1. A system for fabricating a lightweight semiconductor device, said system including:

a support member;

a bonding station wherein a substrate, having opposed first and second faces, is bonded to the support member so that the first face thereof is joined to said support member so as to define a junction region therebetween, and the second face thereof is a free face;

a fabrication station operative to fabricate a semiconductor device upon the second face of the substrate;

a debonding station including a source of radiant energy operative to direct a beam of radiant energy onto said junction region, and means for removing said substrate from said support member.

2. A system as in claim 1, wherein said fabrication station includes a plurality of glow discharge deposition chambers, each operative to deposit a layer of a semiconductor material.

3. A system as in claim 2, wherein said support member and said substrate are each elongated webs of material, said system further including means for continuously advancing said webs of material through each of said deposition chambers in sequence.

4. A system as in claim 1, wherein said source of radiant energy comprises a laser.

* * * * *